United States Patent
Hanson et al.

(10) Patent No.: US 6,522,171 B2
(45) Date of Patent: Feb. 18, 2003

(54) METHOD OF REDUCING SUB-THRESHOLD LEAKAGE IN CIRCUITS DURING STANDBY MODE

(75) Inventors: David R. Hanson, Brewster, NY (US); Toshiaki Kirihata, Poughkeepsie, NY (US); Gerhard Mueller, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/759,011

(22) Filed: Jan. 11, 2001

(65) Prior Publication Data

US 2002/0089352 A1 Jul. 11, 2002

(51) Int. Cl.$^7$ ............................................ H03K 19/096
(52) U.S. Cl. ........................................... 326/95; 326/98
(58) Field of Search ......................... 326/95, 93, 96–98

(56) References Cited

U.S. PATENT DOCUMENTS 6,002,292 A  * 12/1999  Allen et al. .................. 327/379
6,111,434 A  *  8/2000  Ciraula et al. ................ 326/98

* cited by examiner

Primary Examiner—Michael Tokar
Assistant Examiner—James Cho

(57) ABSTRACT

A dynamic logic circuit having reduced sub-threshold leakage current during standby mode comprises a connection to at least one upper power rail, a connection to a lower power rail, a precharge node, and an output node adapted to be charged to the potential of the upper power rail after a precharge signal is received at the precharge node. A latch on the output node is provided to maintain the potential at the output node, along with at least one input node for receiving at least one evaluation signal to maintain the potential at the output node to the voltage of the upper power rail or reduce the potential at the output node to the potential of the lower power rail. A device is coupled to the output node to set the output node to a potential which minimizes the sub-threshold leakage upon receipt of a standby signal to maintain the potential at the output node at the potential of the upper power rail or at the potential of the lower power rail.

7 Claims, 11 Drawing Sheets

METHOD OF REDUCING SUB-THRESHOLD LEAKAGE IN CIRCUITS DURING STANDBY MODE

BACKGROUND OF THE INVENTION

1. Field of the Invention

This invention relates to integrated circuits and, in particular, to power requirements of integrated circuit chips.

2. Description of Related Art

Integrated circuit chips have power requirements which become increasingly critical as the trend continues toward making circuits smaller and more dense, and operating such devices from battery power. There is constant motivation to reduce chip power usage due to packaging requirements, as well as applications in portable devices which have limited battery power.

A typical prior art low voltage dynamic circuit is shown in FIG. 1. This dynamic logic circuit performs the INVERT logical operation (i.e., INPUT=A, OUTPUT=$\overline{A}$) In operation of the circuit, a negative active pulse, PC is initially provided at the gate of transistor P1 to precharge the output node, OUT, to VDD. The voltage at node OUT is held high by the latch formed by inverters I1 and I3. When input signal A rises to a low voltage logic level 1, the node OUT falls to the ground or logic level '0'. Note that transistor N1 is a low threshold transistor. In some semiconductor technologies, transistor devices with different threshold voltage values are offered. As an example, a technology may offer a standard threshold transistor and a low threshold transistor with 0.6 volts and 0.2 volts, respectively. Recalling that transistor N1 is a low threshold transistor, there is an increase in the overdrive associated with the low voltage signal A received at its gate terminal. After a predefined time, the node OUT is precharged to VDD by a negative active pulse, PC, which is provided at the gate of transistor P1. When the circuit or the chip that it operates upon enters standby mode, input signal A will be a logic level 0 and the node OUT will be latched at a logic level 1. This enables a sub-threshold leakage path from $V_{DD}$ (logic level '1') to ground (logic level '0') through the low threshold transistor N1. The sub-threshold leakage is proportional to the width of the device. If this type of circuit is frequently used on an integrated circuit chip with wiring at the sub-micron level, the sub-threshold leakage could be in the range of microamperes, which is considered excessive.

One known solution in the prior art is shown in FIG. 2. The circuit adds a standard threshold transistor N2 between the drain of transistor N1 and the drain of transistor P1 that limits the sub-threshold leakage. This circuit requires an additional device N2, which has a higher threshold voltage than transistor N2, and therefore has the disadvantage of resulting in increased size and degraded performance if the circuit is used to drive a bus. Another known prior art solution is shown in FIG. 3. This circuit limits the sub-threshold leakage by decreasing the logic level '0' from ground down to negative voltages, e.g., −1V to −2V. This solution is undesirable since it has increased power dissipation associated with the larger voltage swing (from $V_{NEG}$ to $V_{DD}$) at node A. Accordingly, there exists a long-felt need for a method to reduce the amount of sub-threshold leakage associated with circuits utilizing low threshold devices and thereby reduce standby or sleep mode current leakage.

Bearing in mind the problems and deficiencies of the prior art, it is therefore an object of the present invention to provide a method and system which reduces the amount of sub-threshold leakage associated with circuits utilizing low threshold devices.

It is another object of the present invention to provide a method and system which increases integrated circuit chip performance by reducing standby or sleep mode current leakage.

A further object of the invention is to provide an improved integrated circuit chip for use in low power and portable devices.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a dynamic logic circuit having reduced sub-threshold leakage current during standby mode which comprises a connection to at least one upper power rail, a connection to a lower power rail, a precharge node, and an output node adapted to be charged to the potential of the upper power rail after a precharge signal is received at the precharge node. A latch on the output node is provided to maintain the potential at the output node, along with at least one input node for receiving at least one evaluation signal to maintain the potential at the output node to the voltage of the upper power rail or reduce the potential at the output node to the potential of the lower power rail. A device is coupled to the output node to set the output node to a potential which minimizes the sub-threshold leakage upon receipt of a standby signal to maintain the potential at the output node at the potential of the upper power rail or at the potential of the lower power rail.

The device coupled to the output node to set the output node to a potential which minimizes the sub-threshold leakage may comprise a PFET transistor coupled between the upper power rail and the output node which, upon receipt of a standby signal, maintains the potential of the output node at the potential of the upper power rail. Alternatively, the device comprises an NFET transistor coupled between the lower power rail and the output node which, upon receipt of a standby signal, maintains the potential of the output node at the potential of the lower power rail.

The dynamic logic circuit may include a transistor coupled to the at least one upper power rail and the output node adapted to set the potential of the output node to the upper power rail voltage upon receipt of the precharge signal, and at least one transistor coupled to the lower power rail and the output node adapted to set the potential of the output node to the lower power rail potential upon receipt of the evaluation signal. The device coupled to the output node to set the output node to a potential which minimizes the sub-threshold leakage is then adapted to set the output node to the lower power rail potential upon receipt of the standby signal.

In one embodiment the dynamic logic circuit includes a first transistor coupled to the at least one upper power rail and the output node adapted to set the potential of the output node to the upper power rail voltage upon receipt of the precharge signal, a second transistor coupled to the lower power rail, third and fourth transistors serially coupled between the second transistor and the first transistor and output node, and a fifth transistor coupled between the second transistor and the first transistor and output node. The second, third, fourth and fifth transistors are adapted to set the potential of the output node to the lower power rail potential upon receipt of the evaluation signal. The device coupled to the output node to set the output node to a potential which minimizes the sub-threshold leakage comprises a transistor coupled to the lower power rail and the output node adapted to set the output node to the lower power rail potential upon receipt of the standby signal.

In another embodiment, the dynamic logic circuit includes a first transistor coupled to the at least one upper power rail and the output node adapted to set the potential of the output node to the upper power rail voltage upon receipt of the precharge signal, and a pair of second and third transistors serially coupled to the lower power rail and the output node adapted to set the potential of the output node to the lower power rail potential upon receipt of the evaluation signal. The device coupled to the output node to set the output node to a potential which minimizes the sub-threshold leakage comprises a transistor coupled to the lower power rail and the output node adapted to set the output node to the lower power rail potential upon receipt of the standby signal.

In a further embodiment, the dynamic logic circuit includes a first transistor coupled to the at least one upper power rail and the output node adapted to set the potential of the output node to the upper power rail voltage upon receipt of the precharge signal, and a pair of second and third transistors serially coupled to the lower power rail and the output node adapted to set the potential of the output node to the lower power rail potential upon receipt of the evaluation signal. The device coupled to the output node to set the output node to a potential which minimizes the sub-threshold leakage comprises a tristate buffer coupled to the latch adapted to disable the latch and permit the output node to discharge to the lower power rail potential upon receipt of the standby signal.

In yet another embodiment, the dynamic logic circuit includes at least two upper power rails, a PFET transistor coupled to each of the upper power rails and the output node adapted to set the potential of the output node to the upper power rail voltages upon receipt of the precharge signal at one of the transistors coupled to the upper power rails, and at least one transistor coupled to the lower power rail and the output node adapted to set the potential of the output node to the lower power rail potential upon receipt of the evaluation signal. The device coupled to the output node to set the output node to a potential which minimizes the sub-threshold leakage comprises a transistor coupled to the lower power rail and the output node adapted to set the output node to the lower power rail potential upon receipt of the standby signal.

The dynamic logic circuit may include a transistor coupled to the at least one upper power rail and the output node adapted to set the potential of the output node to the upper power rail voltage upon receipt of the precharge signal, and at least one transistor coupled to the lower power rail and the output node adapted to set the potential of the output node to the lower power rail potential upon receipt of the evaluation signal. The device coupled to the output node to set the output node to a potential which minimizes the sub-threshold leakage is adapted to set the output node to an upper power rail potential upon receipt of the standby signal.

Another embodiment of the dynamic logic circuit includes at least two upper power rails, an NFET transistor coupled to each of the upper power rails and the output node adapted to set the potential of the output node to the upper power rail voltages upon receipt of the precharge signal at one of the transistors coupled to the upper power rails, and at least one transistor coupled to the lower power rail and the output node adapted to set the potential of the output node to the lower power rail potential upon receipt of the evaluation signal. The device coupled to the output node to set the output node to a potential which minimizes the sub-threshold leakage comprises a transistor coupled to an upper power rail and the output node adapted to set the output node to an upper power rail potential upon receipt of the standby signal.

A further embodiment of the dynamic logic circuit includes at least two NFET transistors having different threshold voltages coupled to the upper power rail, with the output node being adapted to set the potential of the output node to a difference between the upper power rail voltage and the NFET transistor threshold voltage upon receipt of the precharge signal at one of the transistors coupled to the upper power rail. At least one transistor is coupled to the lower power rail and the output node adapted to set the potential of the output node to the lower power rail potential upon receipt of the evaluation signal. The device coupled to the output node to set the output node to a potential which minimizes the sub-threshold leakage comprises a transistor coupled to the upper power rail and the output node adapted to set the output node to the upper power rail potential upon receipt of the standby signal.

Yet another embodiment of the dynamic logic circuit includes an NFET transistor coupled to the upper power rail having a potential lower than the maximum available potential, and the output node adapted to set the potential of the output node to the upper power rail voltage upon receipt of the precharge signal at the NFET transistor coupled to the upper power rail, and at least one NFET transistor coupled to the lower power rail and the output node adapted to set the potential of the output node to the lower power rail potential upon receipt of the evaluation signal. The device coupled to the output node to set the output node to a potential which minimizes the sub-threshold leakage comprises a transistor coupled to the upper power rail and the output node adapted to set the output node to the upper power rail potential upon receipt of the standby signal.

In another aspect, the present invention provides a dynamic logic circuit having reduced sub-threshold leakage current during standby mode which comprises a connection to at least one upper power rail, a connection to a lower power rail, a precharge node, and an output node adapted to be charged to the potential of the upper power rail after a precharge signal is received at the precharge node. A latch on the output node is provided to maintain the potential at the output node, along with at least one input node for receiving at least one evaluation signal to maintain the potential at the output node to the voltage of the upper power rail or reduce the potential at the output node to the potential of the lower power rail. There is also provided a PFET transistor coupled to the at least one upper power rail and the output node adapted to set the potential of the output node to the upper power rail voltage upon receipt of the precharge signal, a first NFET transistor coupled to the lower power rail, a pair of second and third NFET transistors serially coupled between the first NFET transistor and the PFET transistor and output node, and a fourth NFET transistor coupled between the first NFET transistor and the PFET transistor and output node. The second, third and fourth NFET transistors are adapted to set the potential of the output node to the lower power rail potential upon receipt of the evaluation signal. A fifth NFET transistor is coupled to the lower power rail and the output node adapted to set the output node to the lower power rail potential upon receipt of a standby signal to minimize the sub-threshold leakage.

A further aspect of the present invention provides a low voltage bus driver circuit having reduced sub-threshold leakage current during standby mode which comprises a connection to at least one upper power rail, a connection to a lower power rail, a precharge node, and an output node adapted to be charged to the potential of the upper power rail after a precharge signal is received at the precharge node. A latch is provided on the output node to maintain the potential at the output node, along with at least one input node for receiving at least one evaluation signal to maintain the potential at the output node to the voltage of the upper power rail or reduce the potential at the output node to the potential of the lower power rail. An NFET transistor is coupled to the upper power rail having a potential lower than the maximum available potential, with the output node being adapted to set the potential of the output node to the upper power rail voltage upon receipt of the precharge signal at the NFET transistor coupled to the upper power rail. At least one NFET transistor is coupled to the lower power rail and the output node adapted to set the potential of the output node to the lower power rail potential upon receipt of the evaluation signal. A PFET transistor is coupled to the upper power rail and the output node adapted to set the output node to the upper power rail potential upon receipt of the standby signal to minimize the sub-threshold leakage.

Yet another aspect of the present invention provides a low voltage bus driver circuit having reduced sub-threshold leakage current during standby mode which comprises a connection to at least one upper power rail, a connection to a lower power rail, a precharge node, and an output node adapted to be charged to the potential of the upper power rail after a precharge signal is received at the precharge node. A latch on the output node is provided to maintain the potential at the output node, along with at least one input node for receiving at least one evaluation signal to maintain the potential at the output node to the voltage of the upper power rail or reduce the potential at the output node to the potential of the lower power rail. A NOR gate and a PFET transistor are coupled to the upper power rail and the output node adapted to set the output node to the upper power rail potential upon receipt of the standby signal to minimize the sub-threshold leakage.

Another aspect of the present invention relates to a method of reducing sub-threshold leakage current during standby mode in a dynamic logic circuit which comprises providing a dynamic logic circuit of the type described above, applying a precharge signal to the precharge node, thereby charging the output node to the potential of the upper power rail, and applying at least one evaluation signal to the at least one input node to maintain the potential at the output node to the voltage of the upper power rail or reduce the potential at the output node to the potential of the lower power rail. The method then includes applying a standby signal to the device coupled to the output node to set the output node to a potential which minimizes the sub-threshold leakage to maintain the potential at the output node at the potential of the upper power rail or at the potential of the lower power rail.

Another related aspect of the present invention provides a method of reducing sub-threshold leakage current during standby mode in a dynamic logic circuit which comprises providing a dynamic receiver comprising a transistor coupled to at least one upper power rail, a connection to a lower power rail, a precharge node, an output node adapted to be charged to the potential of the upper power rail after a precharge signal is received at the precharge node, a latch on the output node to maintain the potential at the output node, and a pair of input nodes coupled to a pair of transistors, which are coupled to the lower power rail and the output node, for receiving at least one evaluation signal to maintain the potential at the output node to the voltage of the upper power rail or reduce the potential at the output node to the potential of the lower power rail. The method then includes applying a precharge signal to the precharge node, thereby charging the output node to the potential of the upper power rail, applying evaluation signals to the input nodes to maintain the potential at the output node to the voltage of the upper power rail or reduce the potential at the output node to the potential of the lower power rail, and applying a standby signal to the input node of one of the transistors, the standby signal comprising a potential lower than the lower power rail, to set the output node to a potential which minimizes the sub-threshold leakage. The the transistors coupled to the input nodes may be a standard threshold NFET and a low threshold NFET, and the standby signal is preferably a negative potential applied to the low threshold NFET.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
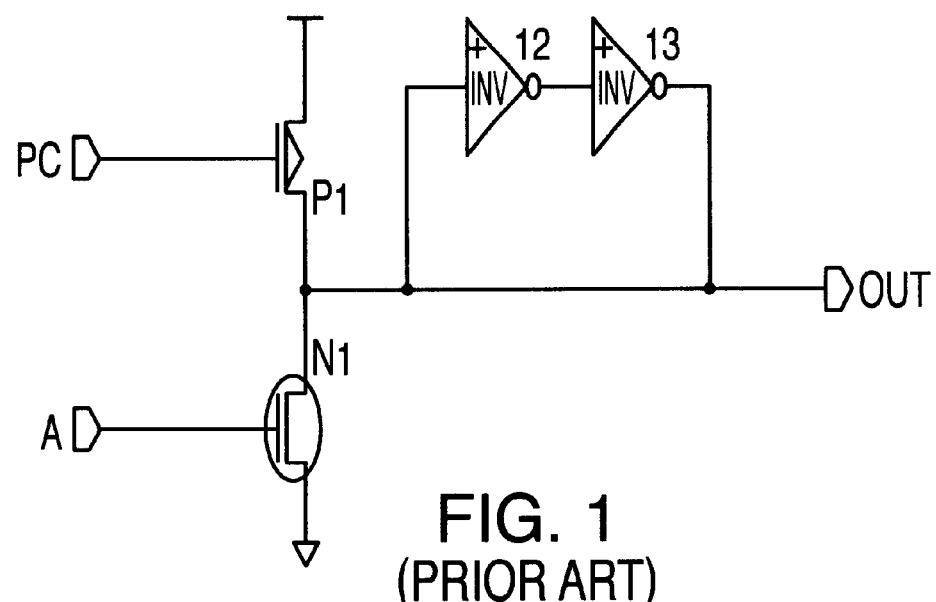
FIG. 1 is a circuit diagram of a prior art low voltage dynamic logic circuit including a low threshold transistor which has undesirable sub-threshold leakage.

In describing the preferred embodiment of the present invention, reference will e made herein to FIGS. 1–12a of the drawings in which like numerals refer to like features of the invention. Features of the invention are not necessarily shown to scale in the drawings.

The present invention is directed to a method and apparatus which reduces the sub-threshold leakage current on a dynamic logic circuit on an integrated circuit chip during standby or sleep mode. The term dynamic logic circuit refers to a circuit that performs logic operations utilizing the properties of capacitive charge on storage nodes. In a dynamic logic circuit, clock signals are used to synchronize the operations of presetting or precharging the initial state of the circuit and evaluation of logic inputs to the circuit at a predetermined rate. The output of the dynamic logic circuit is initialized by the clock and then is allowed to change state based on the logic inputs during a defined portion of the clock cycle. Dynamic logic circuits offer the advantages of increased speed and density over the equivalent static logic circuit. Dynamic logic circuits are more susceptible to charge leakage and charge sharing problems. The present invention may also be employed in integrated circuit chip power-up mode applications. The present invention adds novel circuits or means to set the one or more output nodes of the circuit to one or more potentials which minimize or reduce sub-threshold leakage. These circuits or means are activated in an operation cycle after the precharge signal is given, and/or after one or more logic level evaluation signals are given to create the desired logic level at the output node. Alternatively, these circuits or means are activated in an operation cycle when power is first applied to the integrated circuit chip, this will be subsequently be referred to as the power-on phase of operation. These output potentials can be the lowest level, e.g., ground, or can be higher potentials which still minimize leakage compared to logic circuits which do not employ these additional circuits or means. Different embodiments may use circuits that set or force the output to higher or lower potentials, depending on the types of circuit elements employed. Generally, unless otherwise noted, the upper potential is referred to as $V_{DD}$ or logic level '1', and the lower potential is referred to as ground, $V_{SS}$ or logic level '0'. NFET transistors are designated N1, N2 and the like, while PFET transistors are designated P1, P2 and the like.

Figure 4:
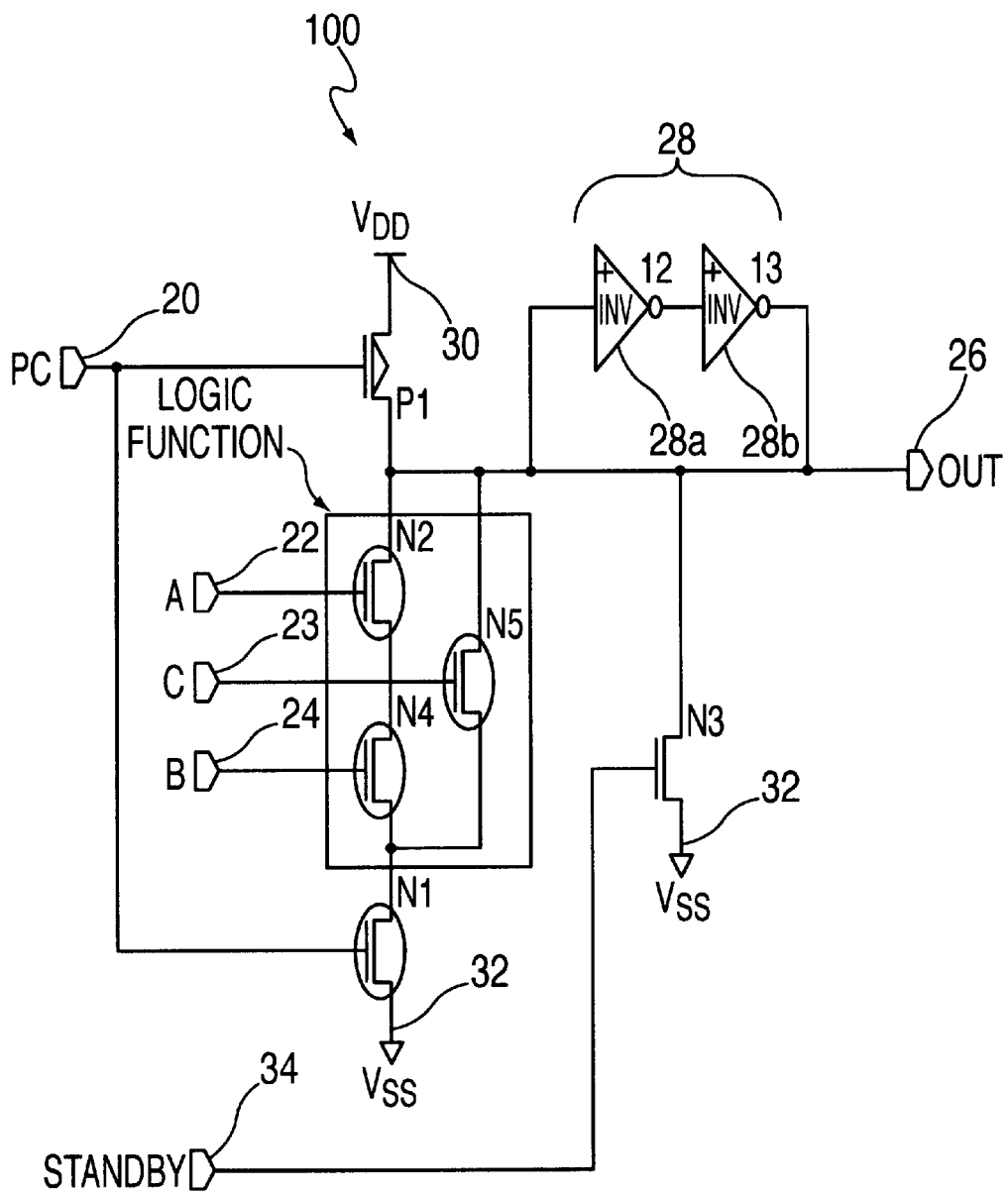
FIG. 4 is a circuit diagram embodying a first embodiment of the present invention which minimizes or reduces sub-threshold current leakage

FIG. 4 shows a first embodiment of the present invention, which adds to a dynamic logic circuit 100 of the type used in a DRAM a device to discharge the output node to ground during standby mode. This dynamic logic circuit performs an AND-OR-INVERT logical operation (i.e., INPUT=A, B, C, OUTPUT=INVERT (A AND B OR C)) The circuit operates in a manner similar to that of FIG. 2, wherein transistor P1 is connected to the upper power rail 30 at $V_{DD}$ and the output at node 26 is precharged to $V_{DD}$ (logic level 1) by a negative active pulse PC applied at precharge node 20 coupled to the transistor P1 gate and to the transistor N1 gate. This occurs when pulse PC, initially at $V_{DD}$ (logic level 1) drops to Vss (logic level 0) at ground 32 for a predetermined time, e.g., 2–5 nanoseconds, and then returns to $V_{DD}$ and logic level 1. During the time pulse PC is at level 0, transistor P1 conducts and charges output node 26 to logic level 1, which in turn sets latch 28, made up of inverters I2 28a and I3 28b, to hold logic level 1. The circuit then waits for addresses or signals at A 22, B 24, and C 23 to be asserted during the evaluation phase. The drain of low threshold transistor N5 is coupled between the drain of P1 and the drain of low threshold transistor N1, the latter of which is connected to the lower power rail at $V_{SS}$, normally ground. Similarly low threshold transistors N2 and N4 are serially connected and are coupled between the drain of P1 and the drain of low threshold transistor N1, the latter of which is connected to the lower power rail at $V_{SS}$, normally ground. However, there is added a standard threshold transistor, N3, connected between $V_{SS}$ and the common drains of P1 and N2 on the output circuit, and latch 28 inverters 12 and 13. When the low voltage evaluation signals A and B at input nodes 22 and 24, respectively, or the low voltage evaluation signal C node 26, is at logic level 1 the output node 26 is discharged to $V_{SS}$ or ground (logic level 0). If only one of the A or B evaluation signal is at logic level 1 or the low voltage evaluation signal C 23 is at logic level 0, there is no discharge of output node 26, and it remains at $V_{DD}$ logic level 1. After a predefined time, in the next data cycle the output node OUT is precharged to $V_{DD}$ by a negative active pulse, PC, which is provided at the precharge node 20 at the gate of transistor P1, and the process repeats.

Figure 2:
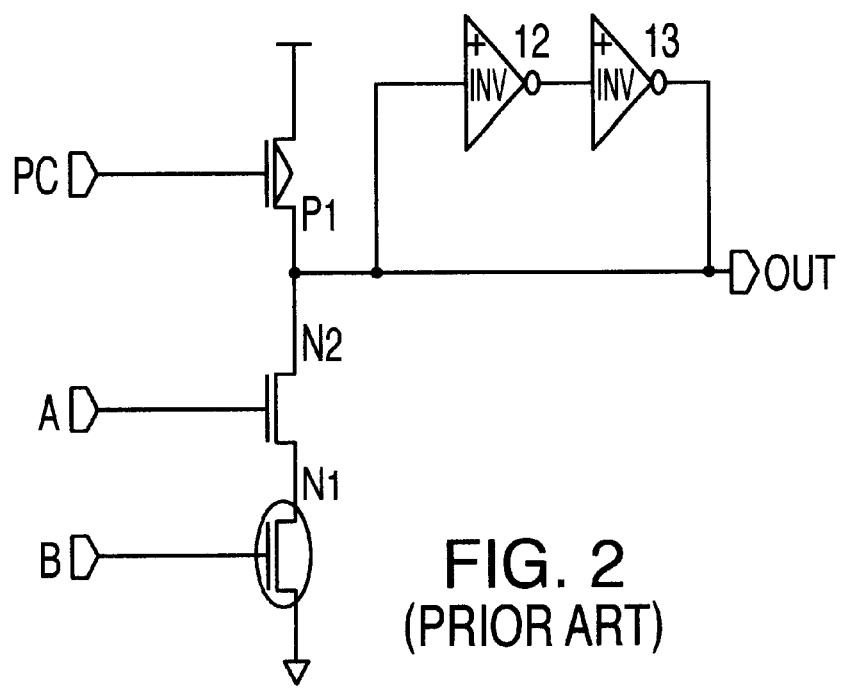
FIG. 2 is a prior art modification to the circuit of FIG. 1.
Figure 3:
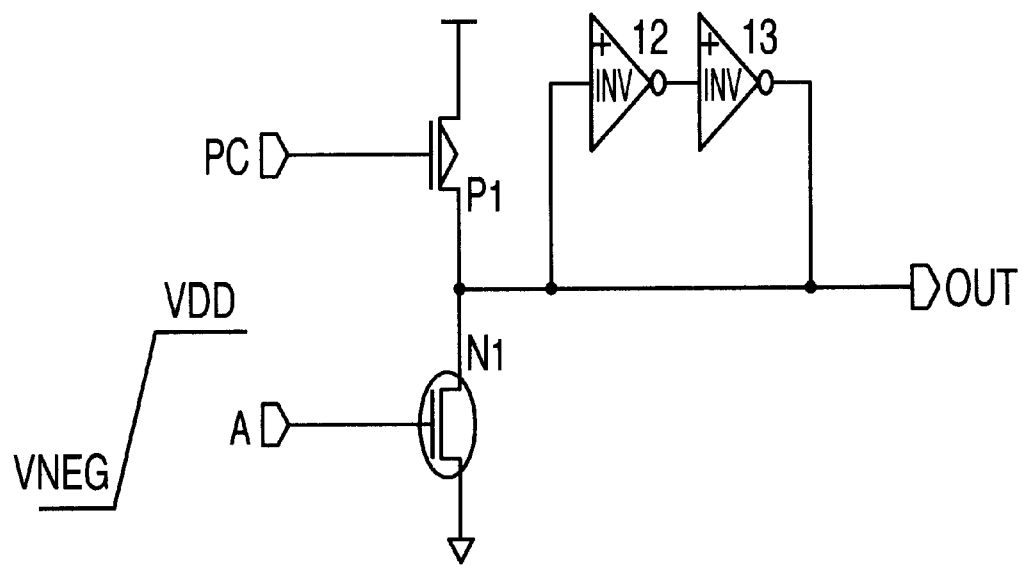
FIG. 3 is another prior art modification to the circuit of FIG. 1.

The difference between the circuit of FIG. 4 and the prior art circuit of FIG. 2 is that when the circuit is in idle or standby mode, as indicated by a standby signal of logic level 1 at the input node 34 at the gate of transistor N3, the output node is discharged to $V_{SS}$, ground and held at that potential by latch 28 formed by inverters I2 and I3. The standby signal is received from a circuit external to the circuit shown. Setting or forcing the output node to $V_{SS}$, ground eliminates the leakage path through the transistors N2, N4 and N1 and through transistors N5 and N1 since output node 26 is not maintained at logic level 1 at $V_{DD}$ (if this is where it was last set), and subsequently limits the sub-threshold leakage of the circuit. When the chip exits standby, the standby signal at node 34 is externally changed to logic level 0, and the precharge signal is again given at node 20 and the circuit enters the next data cycle.

Several subsequent embodiments of the invention will simplify the dynamic logic circuit to a dynamic receiver performing simple logic functions such as INVERT, AND, OR and combinations, thereof.

Figure 5:
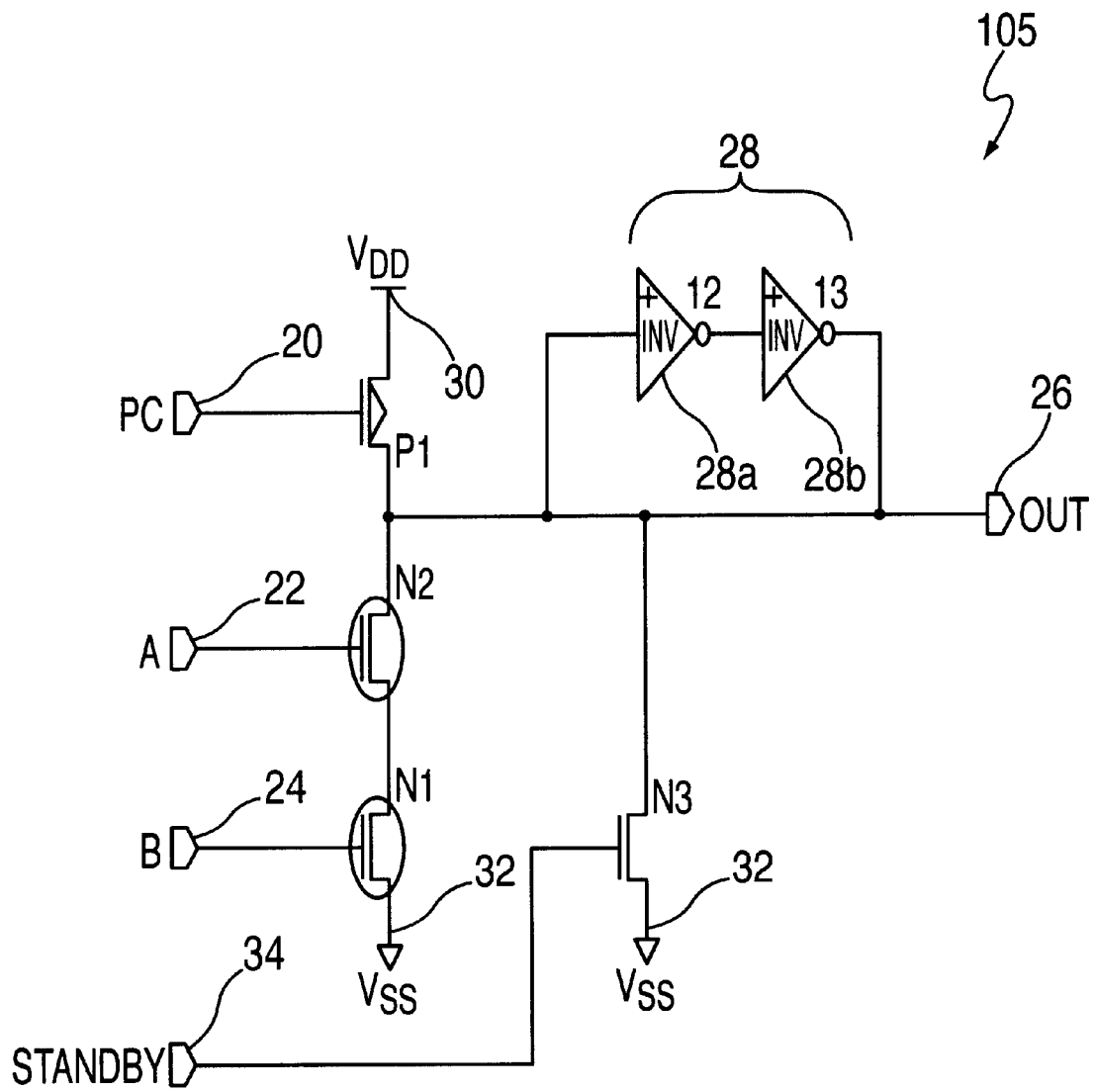
FIG. 5 is a circuit diagram embodying a second embodiment of the present invention which minimizes or reduces sub-threshold current leakage.

FIG. 5 shows a second embodiment of the present invention, which adds to a dynamic receiver 105 of the type used in a DRAM a device to discharge the output node to ground during standby mode. The circuit operates in a manner similar to that of FIG. 2, wherein transistor P1 is connected to the upper power rail 30 at $V_{DD}$ and the output at node 26 is precharged to $V_{DD}$ (logic level 1) by a negative active pulse PC applied at precharge node 20 coupled to the transistor P1 gate. This occurs when pulse PC, initially at $V_{DD}$ (logic level 1) drops to $V_{SS}$ (logic level 0) for a predetermined time, e.g., 2–5 nanoseconds, and then returns to $V_{DD}$ and logic level 1. During the time pulse PC is al level 0, transistor P1 conducts and charges output node 26 to logic level 1, which in turn sets latch 28, made up of inverters I2 28a and I3 28b, to hold logic level 1. The circuit then waits for addresses or signals at A 22 and B 24 to be asserted during the evaluation phase. The drain of standard threshold transistor N2 is coupled between the drain of P1 and the drain of low threshold transistor N1, the latter of which is connected to the lower power rail at $V_{SS}$, normally ground. However, there is added a standard threshold transistor, N3, connected between $V_{SS}$ and the common drains of P1 and N2 on the output circuit, and latch 28 inverters I2 and I3. When the low voltage evaluation signals A and B at input nodes 22 and 24, respectively, are both at logic level 1 the output node 26 is discharged to $V_{SS}$ or ground (logic level 0). If only one of the A or B evaluation signal is at logic level 1, there is no discharge of output node 26, and it remains at $V_{DD}$ logic level 1. After a predefined time, in the next data cycle the output node OUT is precharged to $V_{DD}$ by a negative active pulse, PC, which is provided at the precharge node 20 at the gate of transistor P1, and the process repeats.

The difference between the circuit of FIG. 5 and the prior art circuit of FIG. 2 is that when the circuit is in idle or standby mode, as indicated by a standby signal of logic level 1 at the input node 34 at the gate of transistor N3, the output node is discharged to $V_{SS}$, ground and held at that potential by latch 28 formed by inverters I2 and I3. The standby signal is received from a circuit external to the circuit shown. Setting or forcing the output node to $V_{SS}$, ground eliminates the leakage path through the transistors N2 and N3 since output node 26 is not maintained at logic level 1 at $V_{DD}$ (if this is where it was last set), and subsequently limits the sub-threshold leakage of the circuit. When the chip exits standby, the standby signal at node 34 is externally changed to logic level 0, and the precharge signal is again given at node 20 and the circuit enters the next data cycle.

Figure 6:
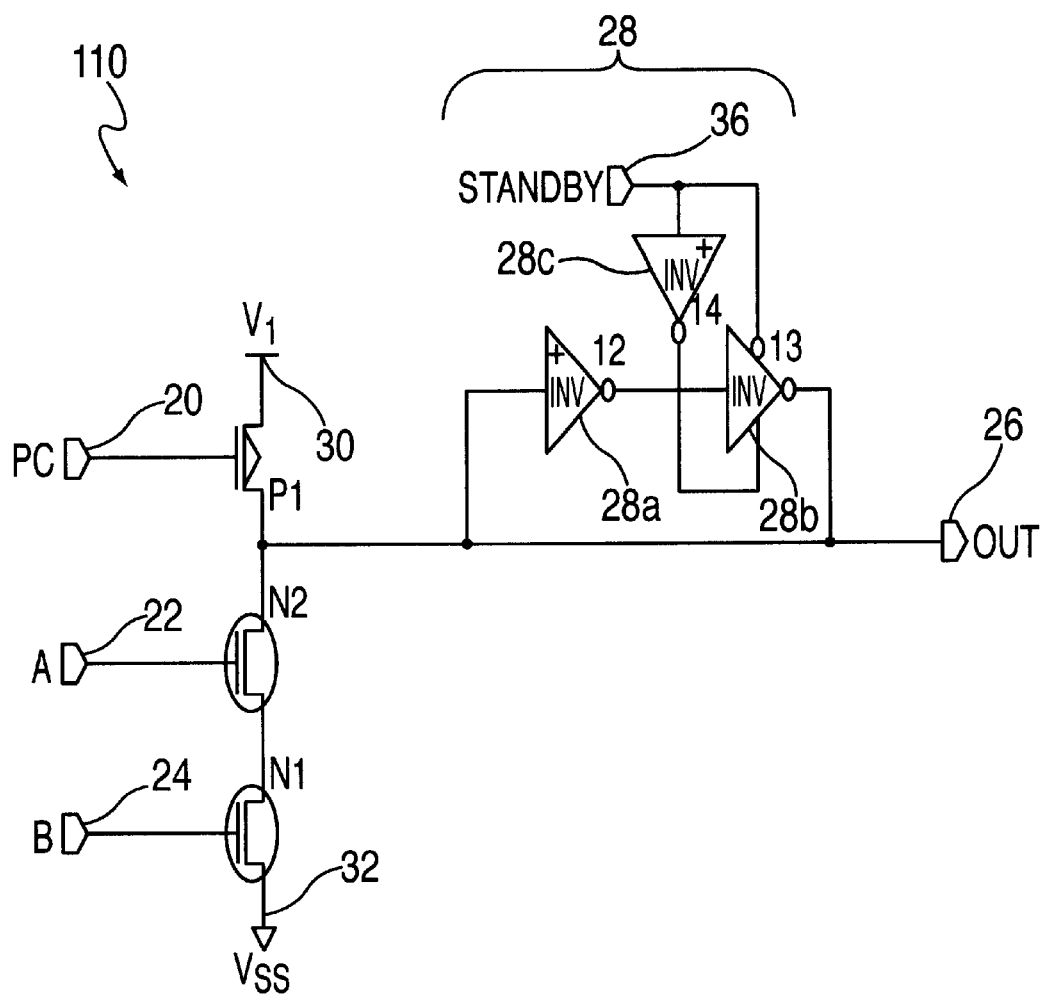
FIG. 6 is a circuit diagram embodying a third embodiment of the present invention which minimizes or reduces sub-threshold current leakage.

FIG. 6 discloses another embodiment of the invention which operates in a manner similar to FIG. 5. However, instead of using a transistor to $V_{SS}$, ground as in FIG. 5, the embodiment of FIG. 6 adds to the dynamic receiver 110 a tristate buffer, inverter 28c, as the last inverter of latch 28. When the output node 26 is at high logic level 1, ($V_{SS}$ potential), the circuit enters standby mode by a transition from logic level 0 to logic level 1 signal at input 36. Inverter 14, 28c, then disables latch 28 and the output node 26 will float and, after a period of time, will discharge to $V_{SS}$, ground, and limit the sub-threshold leakage.

Figure 7:
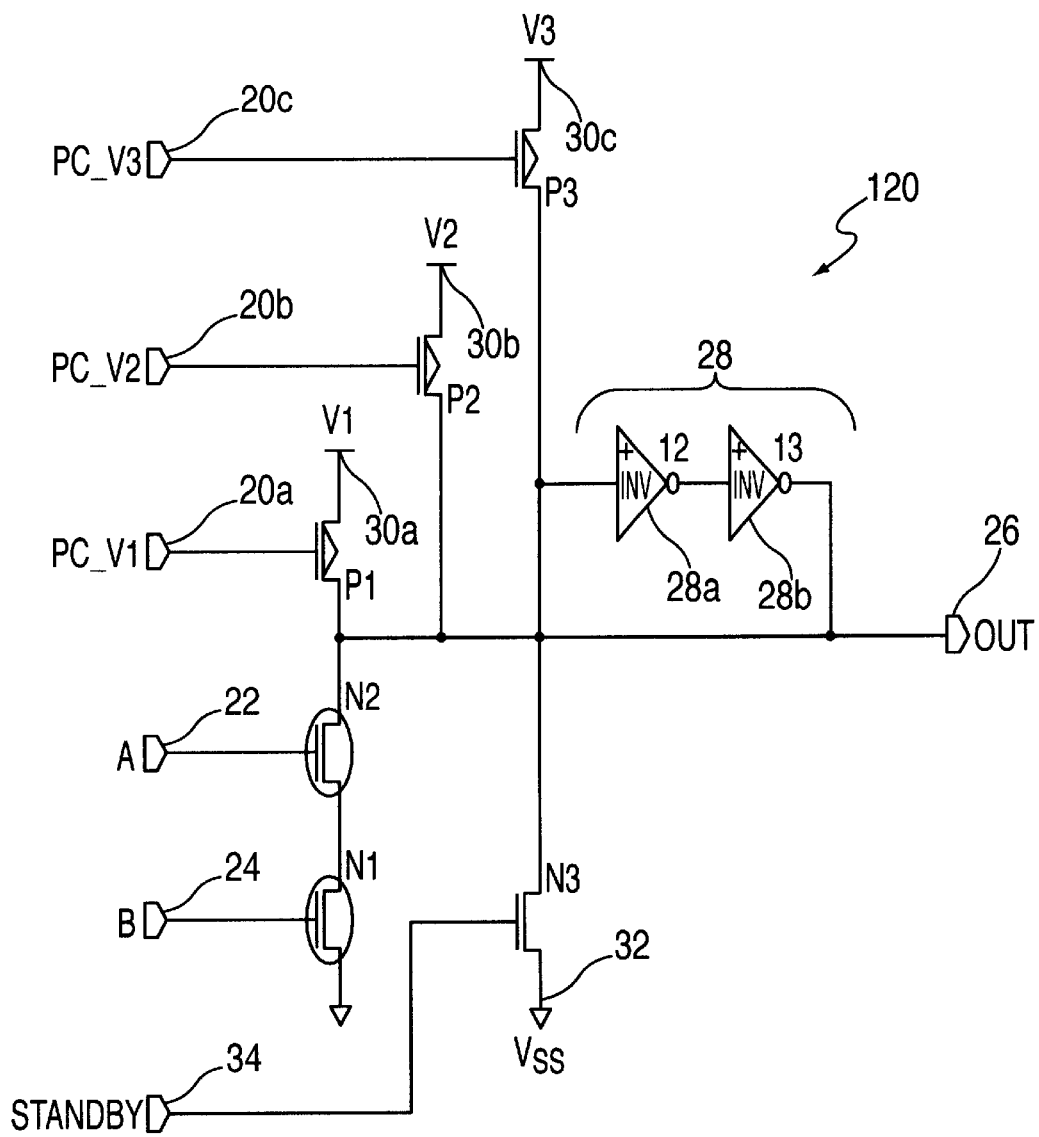
FIG. 7 is a circuit diagram embodying a forth embodiment of the present invention which minimizes or reduces sub-threshold current leakage.

Another embodiment of the invention is disclosed in FIG. 7. This embodiment entails a low voltage dynamic receiver 120 driving a variable strength bus. Transistors N1 and N2 and latch 28 inverters 28a, 28b are provided and connected in a manner similar to FIGS. 5 and 6. However, PFET transistors P1, P2, P3 are respectively connected a plurality of upper power rails V1 (30a), V2 (30b), V3 (30c). The output bus node 26 can be precharged to one of the potentials of V1, V2, V3 by inputting a precharge signal at one of precharge nodes 20a, 20b, 20c, respectively. The device may incorporate any number of transistors P1, P2, P3, . . . , PN at respective potentials of V1, V2, V3, . . . , VN, where V1<V2<V3<VN. For example, V1 may be 1.0 v, V2 may be 1.5 v and V3 may be 2.0 v. A device transistor N3 is added between ground $V_{SS}$ and output node 26 at latch 28. When the standby mode as indicated by a logic level 1 input at node 34 at the gate of transistor N3, the output node is discharged to ground and held at that potential by the latch. This eliminates the leakage path through transistors N1 and N2 and subsequently limits the sub-threshold leakage of the circuit. Without device N3, the sub-threshold leakage would vary in proportions to the size of transistors N1 and N2 and the potential of the output bus 25, i.e., V1, V2, or V3.

Figure 8:
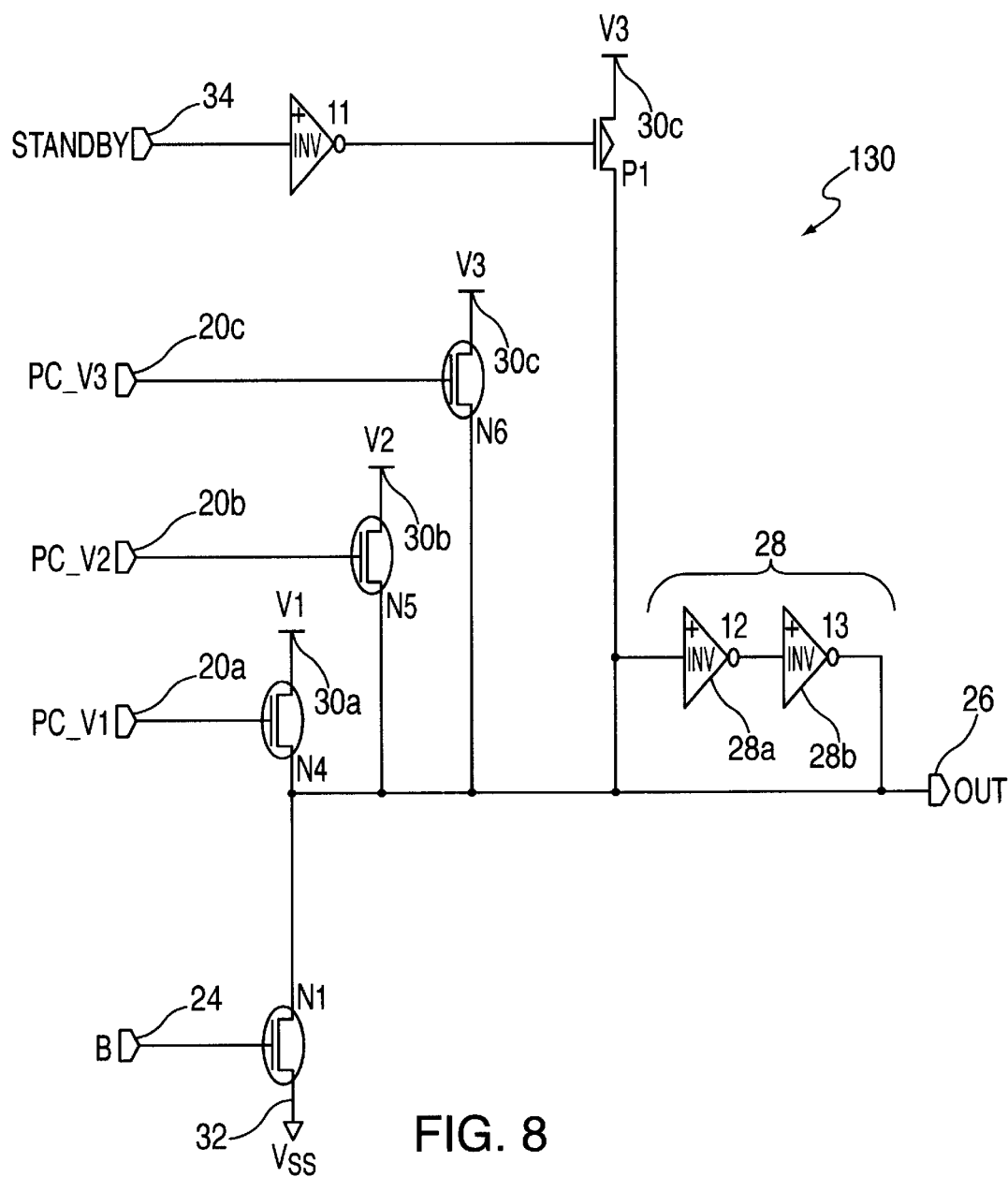
FIG. 8 is a circuit diagram embodying a fifth embodiment of the present invention which minimizes or reduces sub-threshold current leakage.

FIG. 8 demonstrates yet another embodiment of the invention, where a low voltage dynamic receiver/driver 130 drives a variable strength bus comprised of low threshold NFET transistors N4, N5, N6 coupled respectively to upper power rails V1, V2, V3. NFET transistor N1 may be either a nominal threshold device or a low threshold device. In contrast to the previous embodiments, driving the bus high is most important performance criteria in circuit 130. Therefore, the sub-threshold leakage of the pull-up transistors, N4, N5 and N6 is of greater concern than that of device N1. The output bus at node 26 can be precharged to the potential of V1, V2 or V3 where V1<V2<V3. Preferably, the device sizes would scale according to the magnitudes of V1, V2 and V3, i.e., N4<N5<N6, and N6 therefore has he greatest amount of leakage. An inverter I1 and PFET P1 are coupled between upper power rail V3 and output 26 at latch 28 so that, in standby mode as indicated by input of logic level 1 at standby input node 34 coupled to the gate of transistor P1, the output bus 26 is precharged to the greatest upper rail potential V3. This limits the sub-threshold leakage of device N6 and reduces the overall sub-threshold leakage. On the other hand, if N4 were the device that would result in the largest amount of sub-threshold leakage, the output node 26 would be charged to potential V1. This embodiment of the present invention also charges the output node 26 to the voltage which limits the sub-threshold leakage, albeit at the potential of one of the upper power rail instead of the potential of the lower power rail.

Figure 9:
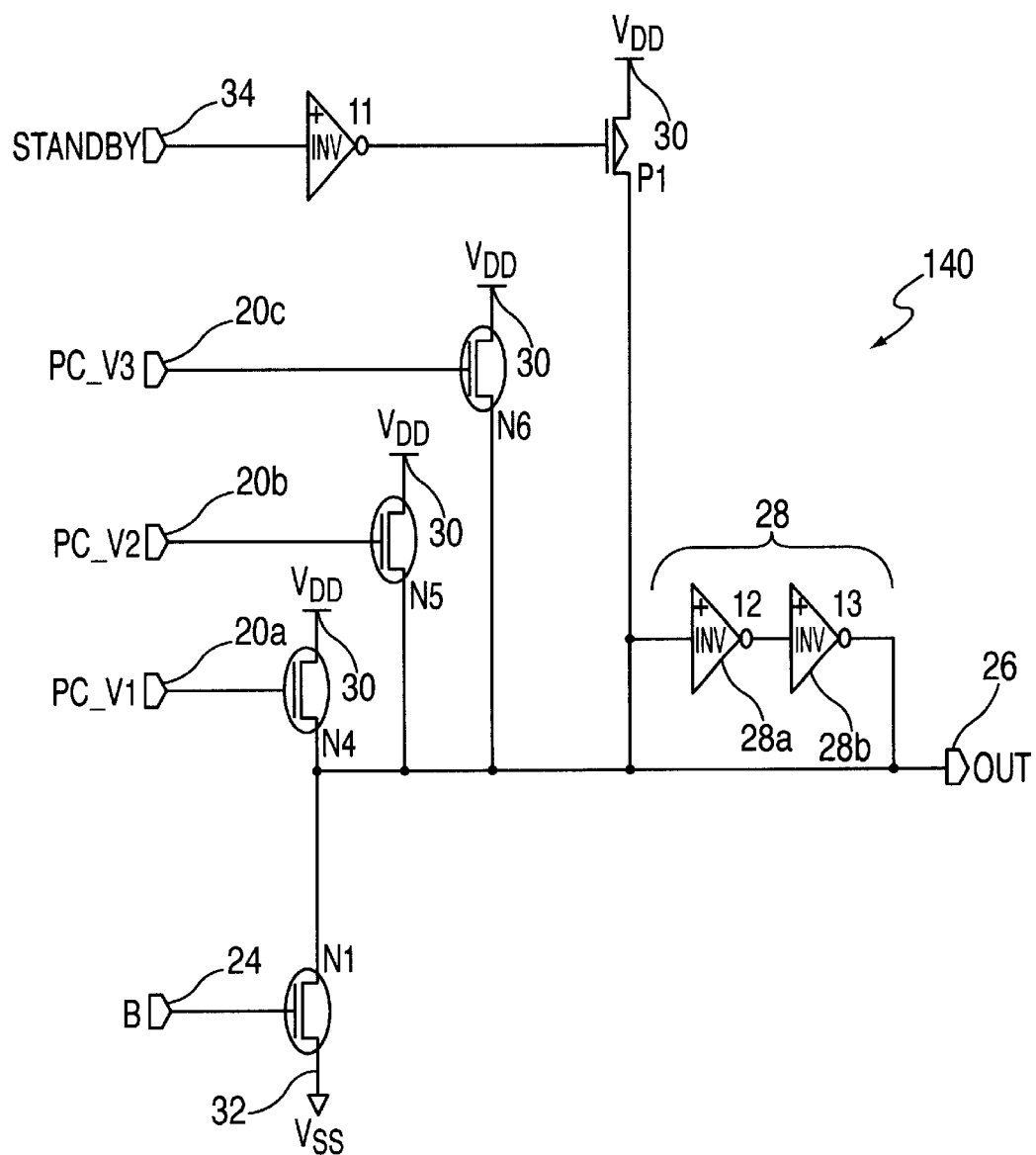
FIG. 9 is a circuit diagram embodying a sixth embodiment of the present invention which minimizes or reduces sub-threshold current leakage.

FIG. 9 demonstrates a further embodiment of the invention, which comprises another example of a low voltage dynamic receiver 140 driving a variable strength bus comprised of variable threshold NFETs N4, N5 and N6, each connected to upper power rail $V_{DD}$. The threshold voltage $V_t$ of pull-up devices N4, N5, N6 in this example varies, for example, $V_{t(N4)}$ is 100 mv, $V_{t(N4)}$ is 500 mv and $V_{t(N4)}$ is 1000 mv. The output bus 26 is precharged to the potential V1, V2 or V3 where V1=$V_{DD}$−$V_{t(N4)}$, V2=$V_{DD}$−$V_{t(N5)}$, and V3=$V_{DD}$=$V_{t(N6)}$. An inverter I1 and PFET P1 are added in a standby circuit, with P1 between upper power rail $V_{DD}$ and output bus 26 at latch 28. In standby mode as indicated by a logic level 1 at the input node 34 couple to the gate of transistor P1, the output bus 26 is precharged to potential $V_{DD}$ to limit the sub-threshold leakage, for a reason similar to that of the previous example, FIG. 8.

Figure 10:
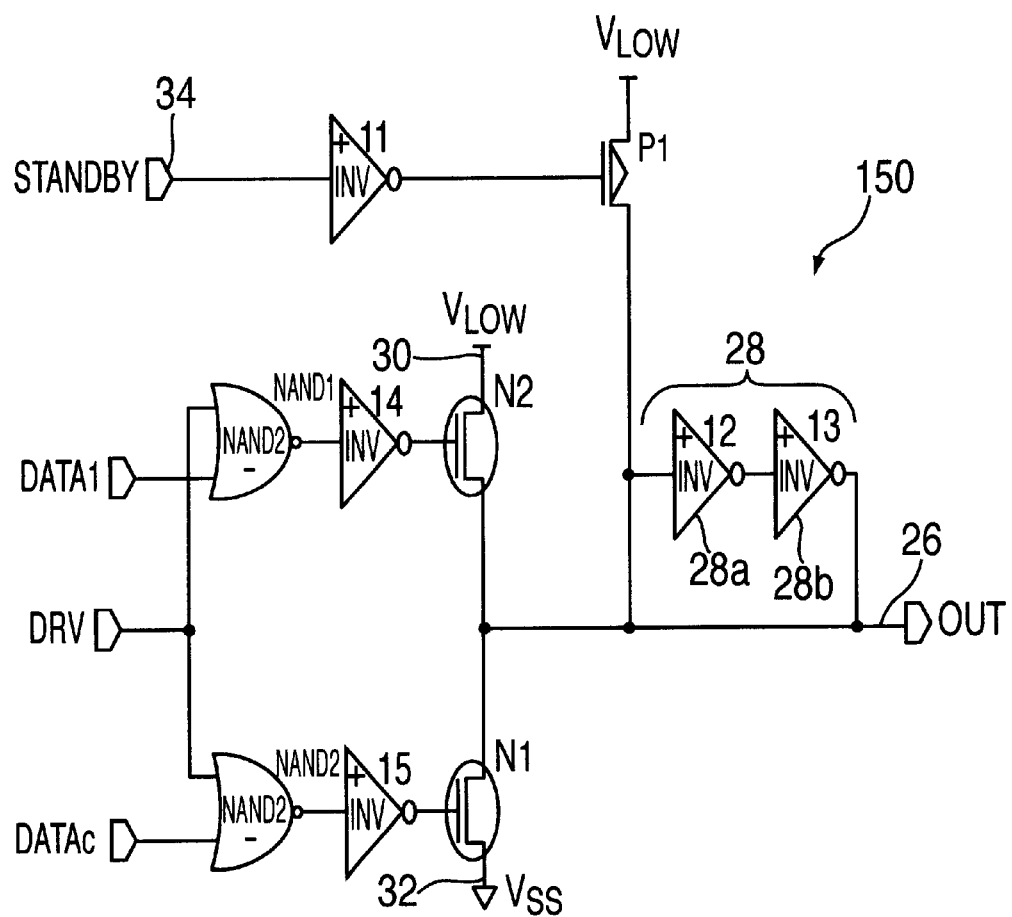
FIG. 10 is a circuit diagram embodying a seventh embodiment of the present invention which minimizes or reduces sub-threshold current leakage.

The embodiment in FIG. 10 represents a low voltage tristate buffer driving a low voltage bus. For example, although the voltage supply $V_{DD}$ may typically be 2.5 v, it may be useful to save power in some devices to switch them from 0 to 1 v. In dynamic receiver circuit 150, an inverter I1 and PFET P1, coupled to upper power rail $V_{LOW}$, are added in a connection to the output bus at latch 28. In standby mode, as indicated by a standby signal at logic level 1 applied at node 34 to the gate of transistor P1, the output bus 26 is precharged by P1 to potential $V_{LOW}$ to limit the sub-threshold leakage of the receiver. This occurs because transistor N2, which pulls the output node up to $V_{LOW}$, is typically twice the size of the pull-down transistor, N1, and therefore there is less current leakage overall at $V_{LOW}$, even though N1 will still leak somewhat.

Figure 11:
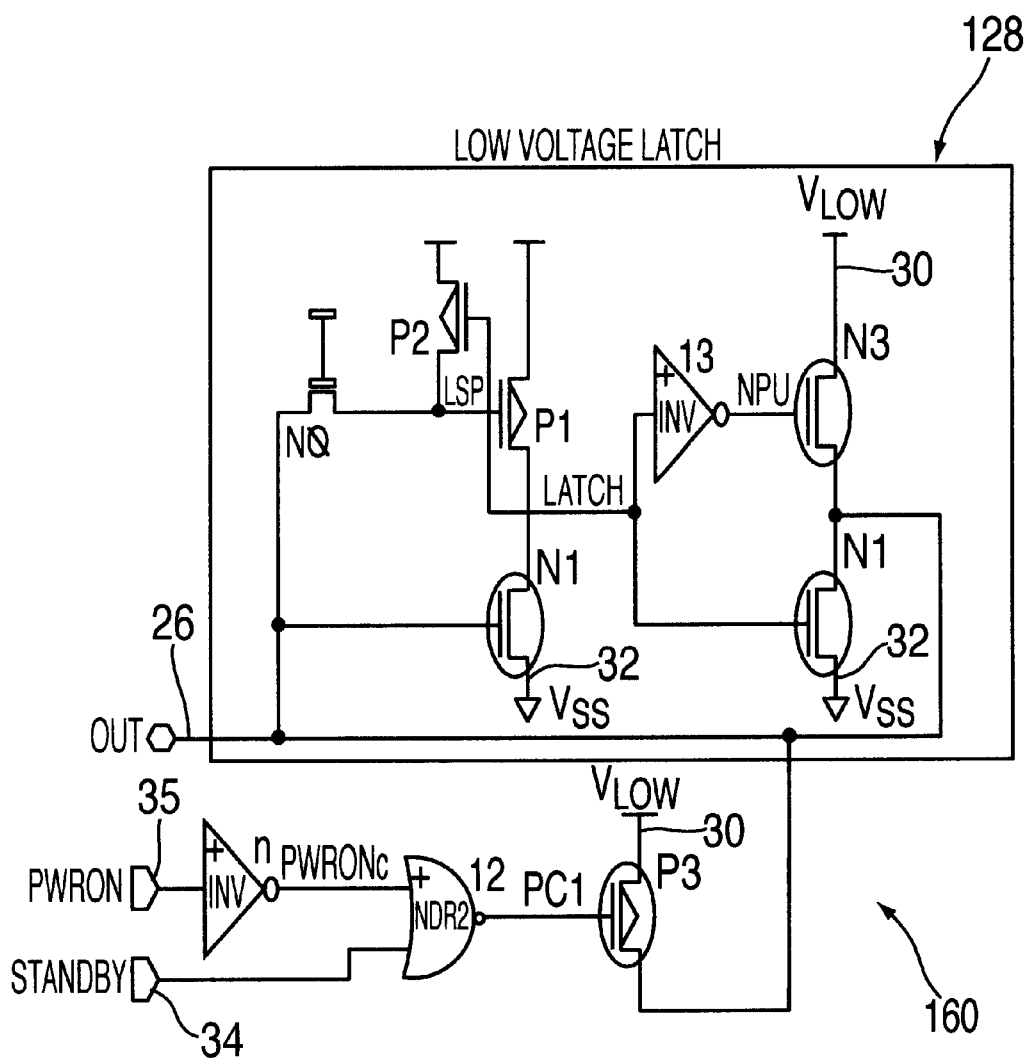
FIG. 11 is a circuit diagram embodying a eighth embodiment of the present invention which minimizes or reduces sub-threshold current leakage.

FIG. 11 demonstrates another embodiment for use with the low voltage tri-state buffer from FIG. 10. It comprises a low voltage latch connected to a low voltage bus and a means to set the potential on the OUT bus to a state that limits the sub-threshold leakage during standby or power-on states. The means is a circuit comprised of an inverter I1, NOR gate I2, and PFET P3. In standby mode as indicated by a standby signal 34 of logic level 0 at the gate of transistor P3, the bus OUT 26 is precharged to potential $V_{LOW}$ This limits the sub-threshold leakage. Alternatively, during chip power-up the PWRON signal 35 is low or at logic level '0'. This will cause a logic level 0 at the gate of transistor P3 and the bus OUT will be precharged to $V_{LOW}$. This limits the sub-threshold leakage.

Figures 12, 12A:
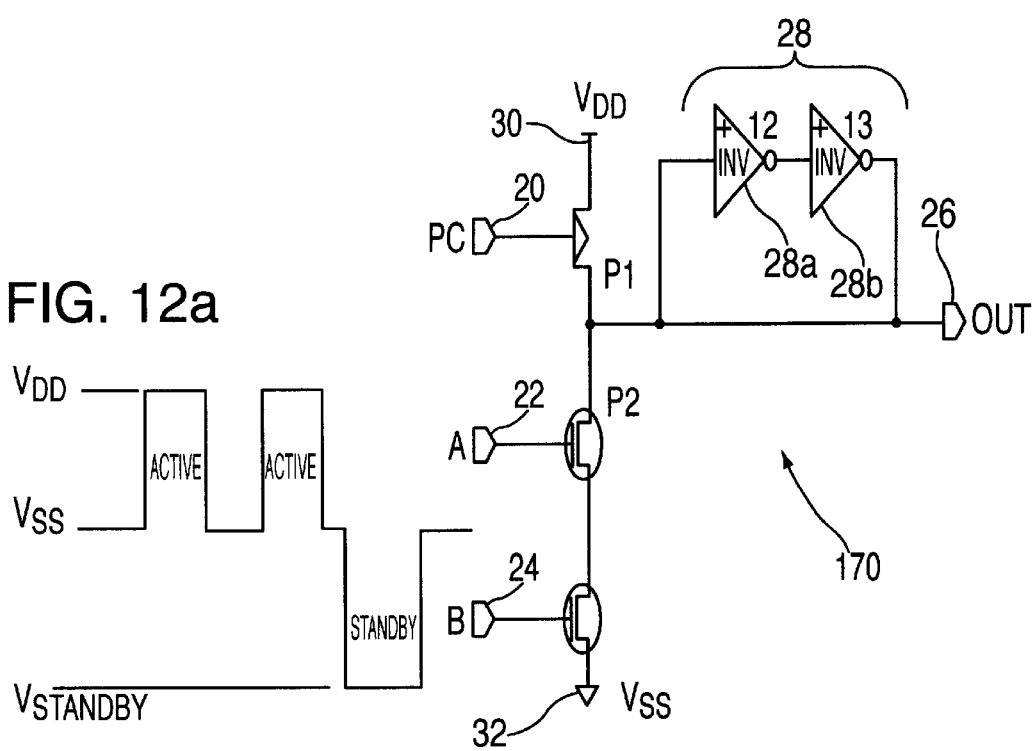
FIG. 12 is a circuit diagram embodying an nineth embodiment of the present invention which minimizes or reduces sub-threshold current leakage.
FIG. 12a is a graphical representation of the standby signal used in FIG. 12.

FIG. 12 discloses another embodiment of the invention. The circuit of FIG. 12 is similar to that of FIGS. 2, 5 and 6, except that the standby mode, and the setting of the output signal to a potential which minimizes the sub-threshold leakage, is performed by the standby signal instead of a separate circuit. Operation of this embodiment entails driving the input node B, 24, with a signal that has three states as shown in FIG. 12a: logic level 1, e.g., at $V_{DD}$, logic level 0, e.g., at $V_{SS}$, and a negative standby voltage $V_{STANDBY}$ corresponding to standby mode. Such standby potential may be, for example, a level of −0.5 v, e.g., a wordline low voltage in a DRAM, or any other suitable negative voltage potential which is available to the circuit. FIG. 12a shows the evaluation signals at input node B, 24, between $V_{DD}$ (logic level 1) and $V_{SS}$ (logic level 0), as well as the negative potential standby signal at $V_{STANDBY}$. The standby signal is received after the precharge signal and evaluation signal(s) are received by the receiver circuit. When the circuit enters standby mode, the node B will be driven below ground, thereby limiting the sub-threshold leakage from output node 26 through transistors N2 and N1.

The present invention is useful in integrated circuits which employ low threshold transistors or other devices, for example, 256 Mb, 512 Mb, or 1 Gb Synchronous Dynamic Random Access Memory (SDRAM) product. The method and apparatus of the present invention reduces the amount of sub-threshold leakage associated with circuits utilizing low threshold devices, and increases integrated circuit chip performance by reducing standby or sleep mode current leakage. It is particularly useful in dynamic receivers for use in low power and portable devices.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A dynamic logic circuit having reduced sub-threshold leakage current during standby mode comprising:
   a connection to at lent one upper power rail;
   a conuection to a lower power rail;
   a precharge node;
   an output node adapted to be charged to the potential of one of the at least one upper power rails after a precharge signal is received at the precharge node;
   a latch on the output node to maintain the potential at the output node;
   at least one input node for receiving at least one evaluation signal to maintain the potential at the output node to the voltage of the upper power rail or reduce the potential at the output node to the potential of the lower power rail;
   a device coupled to the output node to set the output node to a potential which minimizes the sub-threshold leakage upon receipt of a standby signal to maintain the potential at the output node at the potential of the upper power rail or at the potential of the lower power rail and wherein the device coupled to the output node to set the output node to a potential which minimizes the sub-threshold leakage comprises an NFET transistor coupled between the lower power rail and the output node which, upon receipt of the standby signal, maintains the potential of the output node at the potential of the lower power rail.

2. A dynamic logic circuit having reduced sub-threshold leakage current during standby mode comprising:
   a connection to at least one upper power rail;
   a connection to a lower power rail;
   a precharge node;
   an output node adapted to be charged to the potential of the upper power rail after a precharge signal is received at the prechage node;
   a latch on the output node to maintain the potential at the output node;
   at least one input node for receiving at least one evaluation signal to maintain the potential at the output node to the voltage of the upper power rail or reduce the potential at the output node to the potential of the lower power rail;
   a device coupled to the output node to set the output node to a potential which minimizes the sub-threshold leakage upon receipt of a standby signal to maintain the potential at the output node at the potential of the upper power rail or at the potential of the lower power rail;
   a transistor coupled to the at least one upper power rail and the output node adapted to set the potential of the output node to the upper power rail voltage upon receipt of the precharge signal; and
   at least one transistor coupled to the lower power rail and the output node adapted to set the potential of the output node to the lower power rail potential upon receipt of the evaluation signal, and wherein the device coupled to the output node to set the output node to a potential which minimizes the sub-threshold leakage is adapted to set the output node to the lower power rail potential upon receipt of the standby signal.

3. A dynamic logic circuit having reduced sub-threshold leakage current during standby mode comprising:
   a connection to at least one upper power rail;
   a connection to a lower power rail;
   a precharge node;
   an output node adapted to be charged to the potential of the upper power rail after a precharge signal is received at the precharge node;
   a latch on the output node to maintain the potential at the output node;
   at least one input node for receiving at least one evaluation signal to maintain the potential at the output node to the voltage of the upper power rail or reduce the potential at the output node to the potential of the lower power rail;
   a device coupled to the output node to set the output node to a potential which minimizes the sub-threshold leakage upon receipt of a standby signal to maintain the potential at the output node at the potential of the upper power rail or at the potential of the lower power rail;
   a first transistor coupled to the at least one upper power rail and the output node adapted to set the potential of the output node to the upper power rail voltage upon receipt of the precharge signal, a second transistor coupled to the lower power rail, third and fourth transistors serially coupled between the second transistor and the first transistor and output node, and a fifth transistor coupled between the second transistor and the first transistor and output node, the second, third, fourth and fifth transistors adapted to set the potential of the output node to the lower power rail potential upon receipt of the evaluation signal, and wherein the device coupled to the output node to set the output node to a potential which minimizes the sub-threshold leakage comprises a transistor coupled to the lower power rail and the output node adapted to set the output node to the lower power rail potential upon receipt of the standby signal.

4. A dynamic logic circuit having reduced sub-threshold leakage current during standby mode comprising:

a connection to at least one upper power rail;

a connection to a lower power rail;

a precharge node;

an output node adapted to be charged to the potential of one of the at least one upper power rails after a precharge signal is received at the precharge node;

a latch on the output node to maintain the potential at the output node;

at least one input node for receiving at least one evaluation signal to maintain the potential at the output node to the voltage of the upper power rail or reduce the potential at the output node to the potential of the lower power rail;

a device coupled to the output node to set the output node to a potential which minimizes the sub-threshold leakage upon receipt of a standby signal to maintain the potential at the output node at the potential of the upper power rail or at the potential of the lower power rail; a first transistor coupled to the at least one upper power rail and the output node adapted to set the potential of the output node to the upper power rail voltage upon receipt of the precharge signal, and a pair of second and third transistors serially coupled to the lower power rail and the output node adapted to set the potential of the output node to the lower power rail potential upon receipt of the evaluation signal, and wherein the device coupled to the output node to set the output node to a potential which minimizes the sub-threshold leakage comprises a transistor coupled to the lower power rail and the output node adapted to set the output node to the lower power rail potential upon receipt of the standby signal.

5. A dynamic logic circuit having reduced sub-threshold leakage current during standby mode comprising:

a connection to at least one upper power rail;

a connection to a lower power rail;

a precharge node;

an output node adapted to be charged to the potential of one of the at least one upper power rails after a precharge signal is received at the precharge node;

a latch on the output node to maintain the potential at the output node;

at least one input node for receiving at least one evaluation signal to maintain the potential at the output node to the voltage of the upper power rail or reduce the potential at the output node to the potential of the lower power rail;

a PFET transistor coupled to the at least one upper power rail and the output node adapted to set the potential of the output node to the upper power rail voltage upon receipt of the precharge signal, a first NFET transistor coupled to the lower power rail, a pair of second and third NFET transistors serially coupled between the first NFET transistor and the PFET transistor and output node, and a fourth NFET transistor coupled between the first NFET transistor and the PFET transistor and output node, the second, third and fourth NFET transistors adapted to set the potential of the output node to the lower power rail potential upon receipt of the evaluation signal; and a fifth NFET transistor coupled to the lower power rail and the output node adapted to set the output node to the lower power rail potential upon receipt of a standby signal to minimize the sub-threshold leakage.

6. A method of reducing sub-threshold leakage current during standby mode in a dynamic logic circuit comprising:

providing the dynamic logic circuit of claim 5;

applying the precharge signal to the precharge node, thereby charging the output node to the potential of the upper power rail;

applying the at least one evaluation signal to the at least one input node to maintain the potential at the output node to the voltage of the upper power rail or reduce the potential at the output node to the potential of the lower power rail; and applying the standby signal to the fifth NFET transistor coupled to the output node to set the output node to a potential which minimizes the sub-threshold leakage to maintain the potential at the output node at the potential of the lower power rail.

7. A method of reducing subthreshold leakage current during standby mode in a dynamic logic circuit comprising:

providing the dynamic logic circuit of claim 1;

applying the precharge signal to the precharge node, thereby charging the output node to the potential of the upper power rail;

applying the at least one evaluation signal to the at least one input node to maintain the potential at the output node to the voltage of the upper power rail or reduce the potential at the output node to the potential of the lower power rail; and applying the standby signal to the device coupled to the output node to set the output node to a potential which minimizes the sub-threshold leakage to maintain the potential at the output node at the potential of the upper power rail or at the potential of the lower power rail, wherein the transistors coupled to the input nodes are a standard threshold NFET and a low threshold NFET, and the standby signal is a negative potential applied to the low threshold NFET.

* * * * *